US012803551B2

(12) United States Patent
Jang

(10) Patent No.: US 12,803,551 B2
(45) Date of Patent: Nov. 17, 2026

(54) GATE DRIVE DEVICE AND SEMICONDUCTOR DEVICE INCLUDING THE SAME

(71) Applicant: HYUNDAI MOBIS CO., LTD., Seoul (KR)

(72) Inventor: Tae Eun Jang, Youngins-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 2 days.

(21) Appl. No.: 19/078,858

(22) Filed: Mar. 13, 2025

(65) Prior Publication Data

US 2025/0309890 A1 Oct. 2, 2025

(30) Foreign Application Priority Data

Apr. 2, 2024 (KR) ........................ 10-2024-0044494

(51) Int. Cl.

*H03K 17/16* (2006.01)
*H02M 1/08* (2006.01)
*H02M 1/00* (2006.01)

(52) U.S. Cl.

CPC ............ *H03K 17/162* (2013.01); *H02M 1/08* (2013.01); *H02M 1/0054* (2021.05)

(58) Field of Classification Search

CPC ..... H03K 17/162; H02M 1/08; H02M 1/0054
USPC .................................................. 327/108–112
See application file for complete search history.

(56) References Cited

U.S. PATENT DOCUMENTS

2012/0032710 A1* 2/2012 Tsukada ............ H03K 17/0828 327/109
2018/0159520 A1 6/2018 Vytla et al.

FOREIGN PATENT DOCUMENTS

EP 3799308 A1 3/2021
JP 6883450 B2 6/2021

* cited by examiner

*Primary Examiner* — Tomi Skibinski
(74) *Attorney, Agent, or Firm* — NovoTechIP International PLLC

(57) ABSTRACT

The present disclosure relates to a gate drive device and a semiconductor device including the same. More specifically, a gate drive device applied to or usable in a semiconductor switch of a semiconductor device includes a gate driver that varies an output voltage level based on environmental information of the semiconductor device, in which the output voltage level is one of +V_GE, −V_GE, and Tr V_GE.

8 Claims, 6 Drawing Sheets

GATE DRIVE DEVICE AND SEMICONDUCTOR DEVICE INCLUDING THE SAME

CROSS-REFERENCE TO RELATED APPLICATIONS

This application claims priority under 35 U.S.C. § 119 to Korean Patent Application No. 10-2024-0044494, filed on Apr. 2, 2024, in the Korean Intellectual Property Office, the disclosure of which is incorporated herein by reference in its entirety.

TECHNICAL FIELD

The following disclosure relates to a gate drive device and a semiconductor device including the same.

BACKGROUND

In general, in a gate drive method of a power module, a gate driving voltage is controlled in two stages. Specifically, the gate driving voltage may include + and −. Meanwhile, a gate resistance may be selected by considering a maximum voltage and a maximum current of a system. In this case, a power module has a breakdown voltage, and a surge voltage may occur depending on the magnitude of voltage, parasitic inductance, and current of the system. Therefore, the gate resistance is selected in order to use the surge voltage below the breakdown voltage.

FIG. 1 is a circuit diagram illustrating a conventional gate drive device.

FIG. 2 is a graph illustrating V_GE according to FIG. 1.

The method illustrated in FIG. 1 has a problem in that a voltage of a gate driver is two-stage (+VGE, −VGE). As a result, the gate resistance is selected based on the maximum voltage and maximum current of the system, but as the gate resistance increases, a switching speed slows down and loss increases. Since it is selected based on the maximum voltage and maximum current of the system, unnecessary loss as illustrated in FIG. 2 may occur due to the fixed resistance value even though faster switching is possible at a lower voltage and current.

SUMMARY

An embodiment of the present disclosure is directed to providing a gate drive device capable of minimizing switching loss in all output sections, and a semiconductor device including the same.

In one general aspect, a gate drive device applied to a semiconductor switch of a semiconductor device includes: a gate driver that varies an output voltage level based on environmental information of the semiconductor device, in which the output voltage level is one of +V_GE, −V_GE, and Tr V_GE.

A voltage magnitude of the Tr V_GE may be different from magnitudes of the +V_GE and the −V_GE.

The gate driver may control a voltage application time of the Tr V_GE to be different from a magnitude of one of the +V_GE and the −V_GE.

The Tr V_GE may be generated based on at least one of I_out, V_DC, temperature, and device speed.

The Tr V_GE may be generated based on at least one of Vce_surge (surge voltage) and a synchronization signal.

The gate driver may further include a linear regulator that stabilizes the generated Tr V_GE.

The gate driver may synchronize a switching moment based on the synchronization signal.

The +V_GE and −V_GE may be controlled by a primary-side input of the gate driver.

In another general aspect, a semiconductor device includes a gate drive device applied to a semiconductor switch of the semiconductor device that includes a gate driver that varies an output voltage level based on environmental information of the semiconductor device, in which the output voltage level is one of +V_GE, −V_GE and Tr V_GE, and a semiconductor switch that is controlled by an output of the gate drive device.

DETAILED DESCRIPTION

In order to describe the present disclosure and the operational advantages of the present disclosure and the objects achieved by the practice of the present disclosure, preferred embodiments of the present disclosure will be exemplified below and the present disclosure will be described with reference thereto.

First, the terms used in this application are only used to describe specific embodiments, and are not intended to limit the present disclosure, and singular expressions may include plural expressions unless the context clearly indicates otherwise. It should be understood that terms "include" or "have" used in the present specification, specify the presence of features, numerals, steps, operations, components, parts mentioned in the present specification, or combinations thereof, but do not preclude the presence or addition of one or more other features, numerals, steps, operations, components, parts, or combinations thereof.

Further, in describing the present disclosure, when it is decided that a detailed description of a related known configuration or function may obscure the gist of the present disclosure, the detailed description will be omitted.

Figure 1:
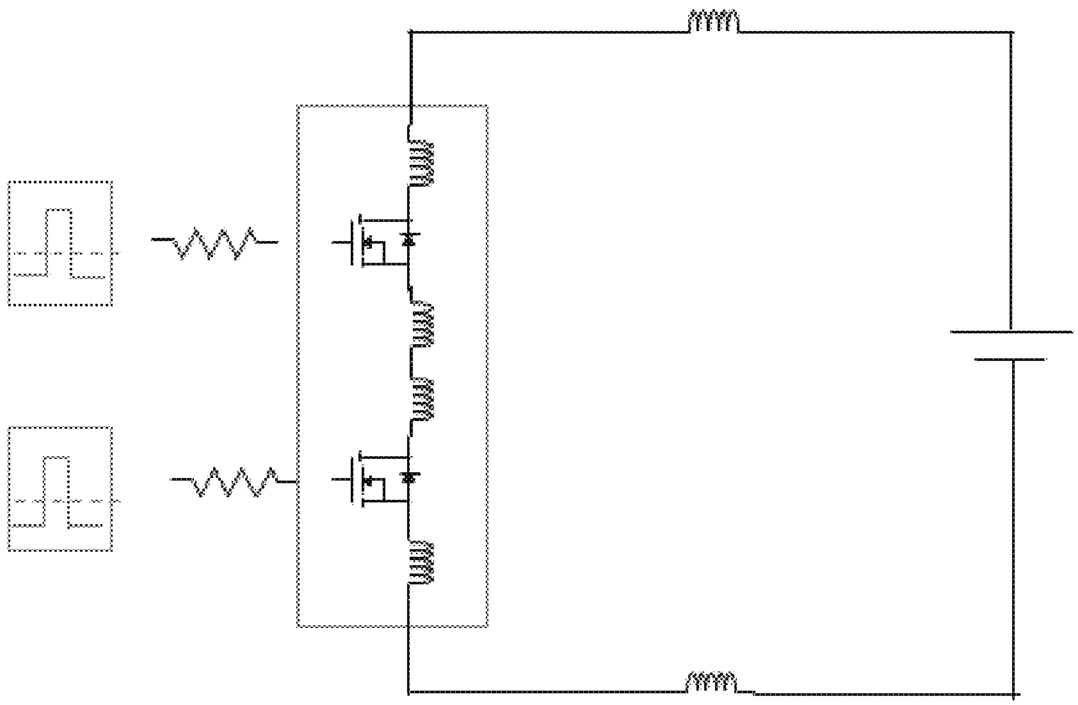
FIG. 1 is a circuit diagram illustrating a conventional gate drive device.
Figure 2:
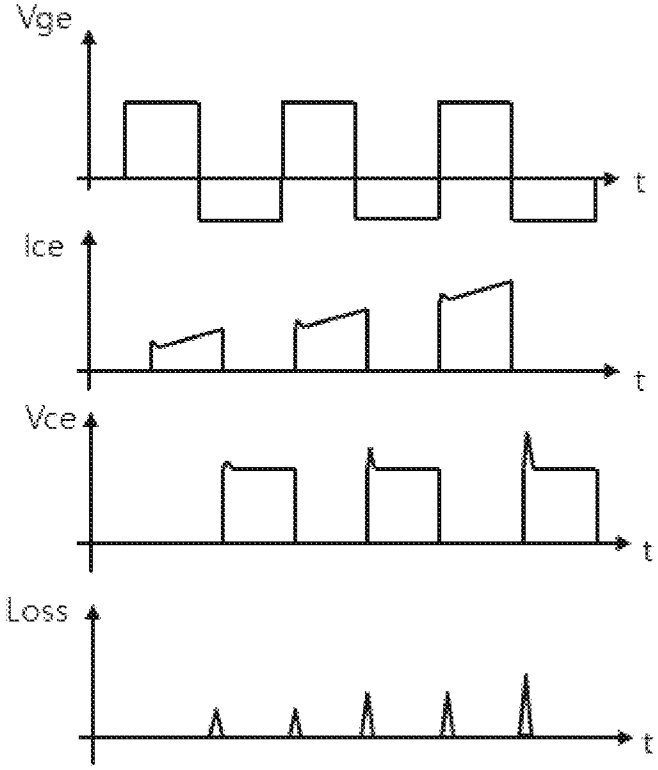
FIG. 2 is a graph illustrating V_GE according to FIG. 1.
Figure 3:
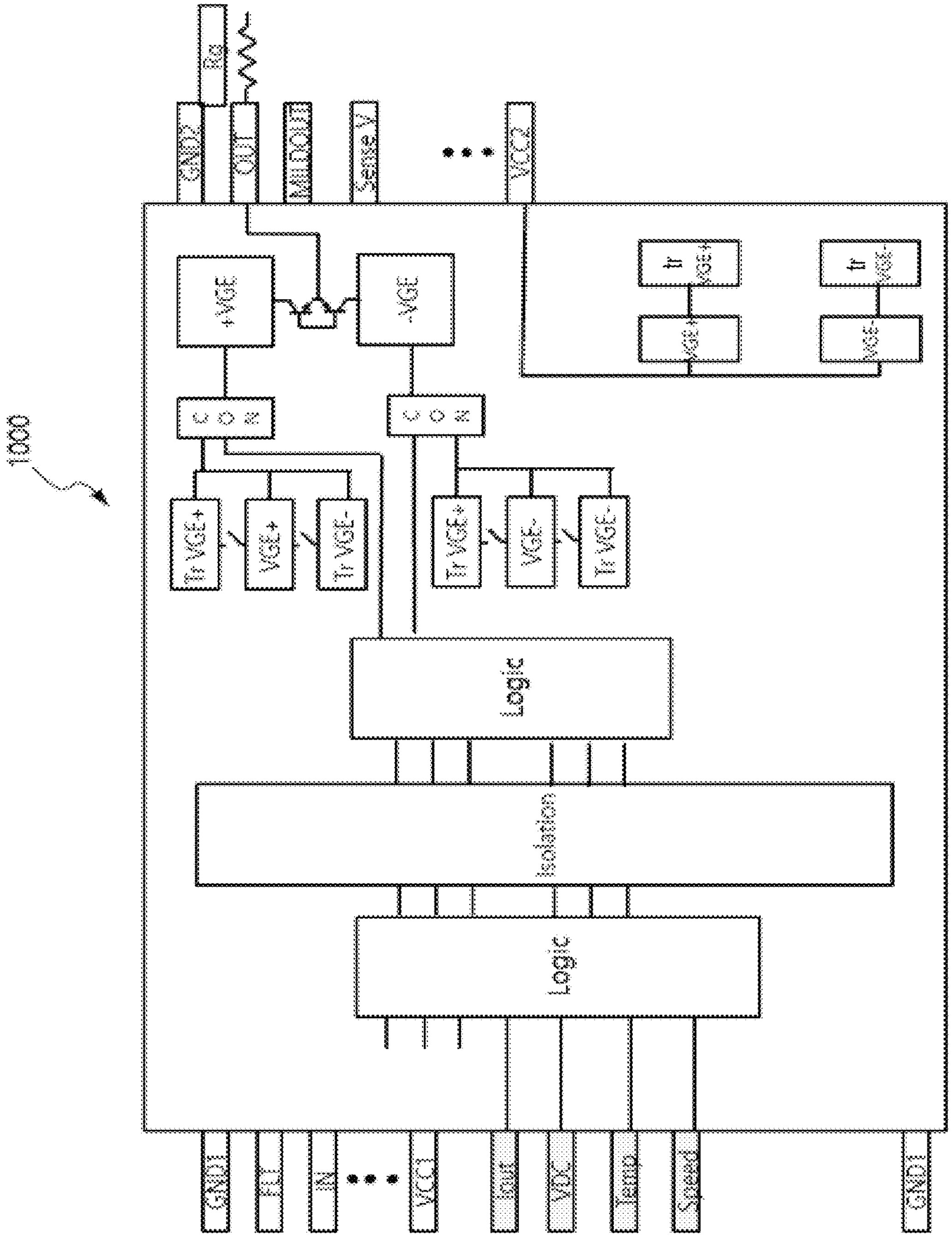
FIG. 3 is a schematic diagram illustrating a gate drive device according to an embodiment of the present disclosure.

FIG. 3 is a schematic diagram illustrating a gate drive device according to an embodiment of the present disclosure.

Figure 4:
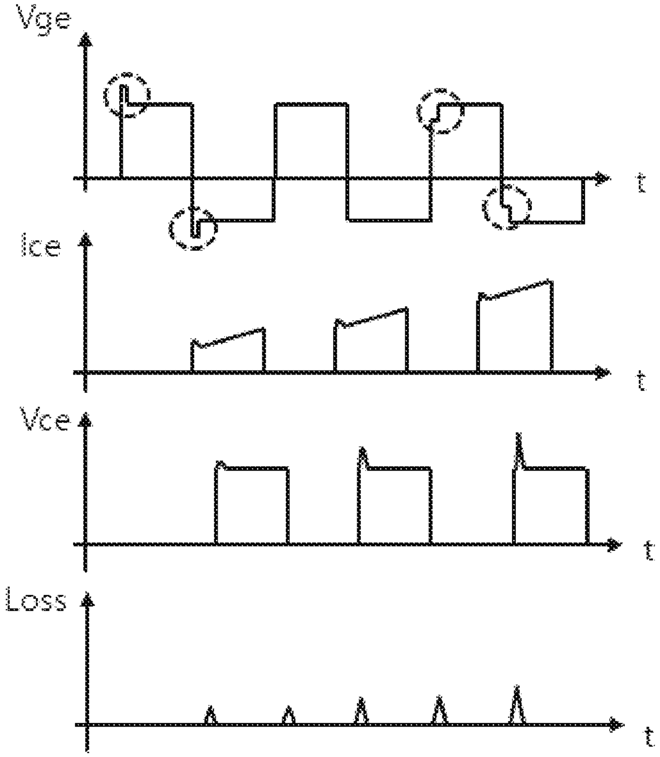
FIG. 4 is a graph illustrating V_GE according to the present disclosure.

FIG. 4 is a graph illustrating V_GE according to the present disclosure.

As illustrated in FIG. 3, a gate drive device applied to or usable in a semiconductor switch of a semiconductor device according to the present disclosure may include a gate driver 1000.

The gate driver 1000 may vary a plurality of gate voltages based on environmental information of the semiconductor device. In this case, the gate driver 1000 may vary an output voltage level in three stages instead of two stages of the gate voltage. Specifically, as illustrated in FIG. 4, the gate driver 1000 may control the output voltage level to be one of a positive gate driving voltage ("+V_GE" hereinafter), a negative gate driving voltage ("−V_GE" hereinafter), and the gate driving voltage of the transistor ("Tr V_GE" hereinafter).

In this case, the gate driver 1000 may apply a voltage that is lower or higher than one of +V_GE and −V_GE for a predetermined period, thereby generating Tr V_GE that includes a magnitude higher or lower than magnitudes of +V_GE and −V_GE.

In addition, the gate driver 1000 may adjust a voltage application time of Tr V_GE to be different from a voltage application time of one of +V_GE and −V_GE, thereby generating Tr V_GE having a width narrower and wider than widths of +V_GE and −V_GE.

Specifically, describing each voltage generation method of the gate driver 1000, the gate driver 1000 may have an output current ("I_out" hereinafter), a DC voltage ("V_DC" hereinafter), a temperature, and a device speed, which are environmental information of the semiconductor device, input to a primary side. In this case, the gate driver 1000 may generate +V_GE, −V_GE, and Tr V_GE based on at least one of the input values.

More specifically, the gate driver 1000 may generate tr VGE+ and tr VGE− based on the I_out, V_DC, temperature, and device speed input to the primary side, and may also generate +V_GE and −V_GE using power input to a secondary side.

Figure 5:
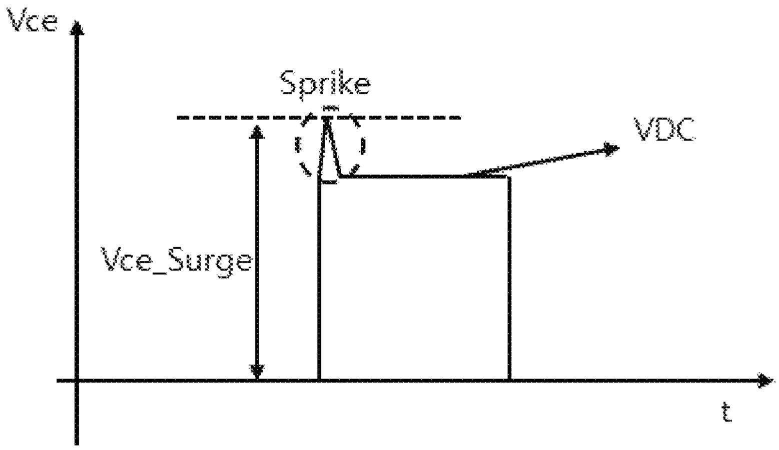
FIG. 5 is a graph illustrating Vce_Surge.

FIG. 5 is a graph illustrating a surge voltage (Vce_Surge).

As illustrated in FIG. 5, Vce_surge may be composed of spike voltage +V_DC. In this case, the spike voltage may be determined by a parasitic inductance component and a current magnitude. Accordingly, the spike voltage may be defined as follows.

$$V\_\text{spike}=L*di/dt$$

In addition, since a rated voltage of the semiconductor device changes depending on the temperature, a temperature parameter may also be an input target.

In addition, the speed of the semiconductor device may be an input target because it is a characteristic of the semiconductor device used.

Meanwhile, the gate driver 1000 may further include a linear regulator, which may stabilize the Tr V_GE generated through the linear regulator. Thereafter, the gate driver 1000 may be connected to a secondary-side output power supply of the gate driver.

In this case, +V_GE and −V_GE may be controlled by the primary-side input.

Figure 6:
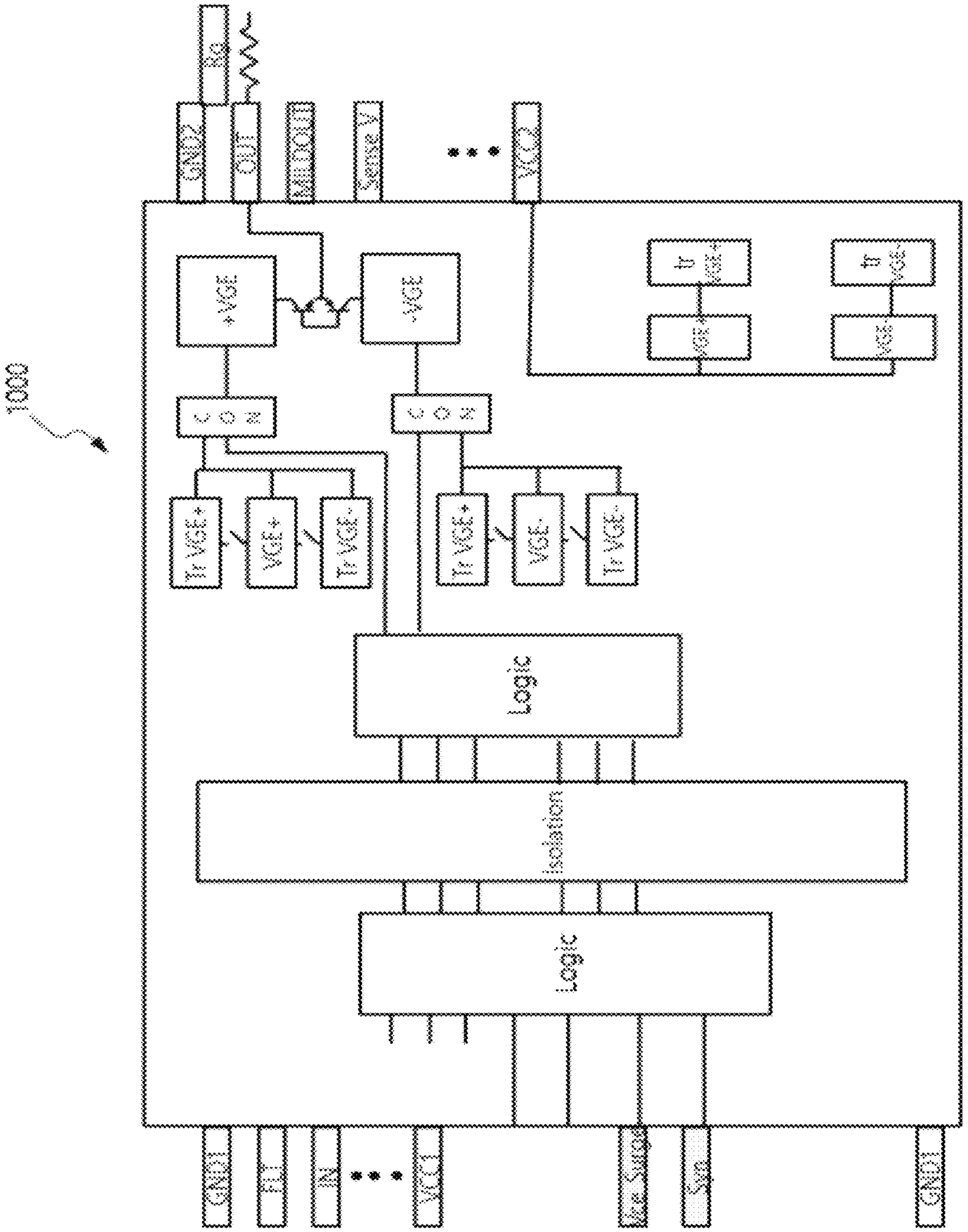
FIG. 6 is a schematic diagram illustrating a gate drive device according to another embodiment of the present disclosure.

FIG. 6 is a schematic diagram illustrating a gate drive device according to another embodiment of the present disclosure.

As illustrated in FIG. 6, according to another embodiment of the present disclosure, the gate driver 1000 may have at least one of Vce_surge (surge voltage) and a synchronization signal Syn, which are environmental information of a semiconductor device, input to the primary side. In this case, the gate driver 1000 may generate +V_GE, −V_GE, and Tr V_GE based on at least one of the input values.

Specifically, in the case of the primary side Vce_surge, a surge voltage of a power module may be converted to a magnitude that can be input to the primary side through a resistance distribution and input.

In addition, the gate driver 1000 may synchronize a switching moment based on the synchronization signal, thereby removing noise.

In addition, the gate driver 1000 may generate +V_GE and −V_GE using power input to the secondary side.

In addition, the Tr V_GE generated by the linear regulator may be stabilized through the linear regulator. Thereafter, the gate driver 1000 may be connected to a secondary-side output power supply of the gate driver.

In this case, +V_GE and −V_GE may be controlled by the primary-side input.

Meanwhile, the semiconductor device according to the present disclosure may include a gate drive device and a switch including the characteristics described above.

The switch may be controlled by the output of the gate drive device.

Accordingly, the present disclosure has the effect of minimizing the switching loss in all output sections by controlling the switch by the gate drive device as described above.

According to the gate drive device and the semiconductor device including the same according to various embodiments of the present disclosure as described above, the gate voltage size is configured in three stages, thereby minimizing the switching loss in all output sections.

Therefore, it is possible to increase the efficiency of the inverter, and increase the driving distance in the case of electric vehicles.

In addition, in the case of the power semiconductor, SiC and GaN devices have been recently developed to reduce the loss, but the switching speed cannot be increased due to the surge voltage. However, by applying various embodiments of the present disclosure, there is an effect of minimizing the loss by driving an appropriate switching speed under appropriate conditions.

Although preferred embodiments of the present disclosure have been described above, the embodiments disclosed in the present disclosure are only for explaining, not limiting, the technical spirit of the present disclosure. Therefore, the technical idea of the present disclosure includes not only each disclosed embodiment but also a combination of the disclosed embodiments, and furthermore, the scope of the technical idea of the present disclosure is not limited by these embodiments. In addition, many modifications and alterations of the present disclosure may be made by those skilled in the art to which the present disclosure pertains without departing from the spirit and scope of the accompanying claims. In addition, it is to be considered that all of these modifications and alterations fall within the scope of the present disclosure.

What is claimed is:

1. A gate drive device configured to drive a semiconductor switch of a semiconductor device, the gate drive device comprising a gate driver configured to vary an output gate-driving voltage based on environmental information of the semiconductor device, wherein the gate driver is configured to selectively set the output gate-driving voltage to be one of:

a first gate-driving voltage (+V_GE), which is a positive voltage greater than zero;

a second gate-driving voltage (−V_GE), which is a negative voltage less than zero; and a third gate-driving voltage (Tr V_GE) having a magnitude different from that of both the first gate-driving voltage and the second gate-driving voltage for a predetermined period.

2. The gate drive device of claim 1, wherein the gate driver is configured to control an application time of the third gate-driving voltage to be different from that of one of the first gate-driving voltage and the second gate-driving voltage.

3. The gate drive device of claim 2, wherein the third gate-driving voltage is generated based on at least one of an output current (I_out), a DC voltage (V_DC), a temperature, and a device speed.

4. The gate drive device of claim 3, wherein the gate driver further includes a linear regulator configured to stabilize the third gate-driving voltage.

5. The gate drive device of claim 3, wherein the first gate-driving voltage and the second gate-driving voltage are controlled by a primary-side input of the gate driver.

6. The gate drive device of claim 2, wherein the third gate-driving voltage is generated based on at least one of a surge voltage (Vce_surge) and a synchronization signal.

7. The gate drive device of claim 6, wherein the gate driver is configured to synchronize a switching moment based on the synchronization signal.

8. The semiconductor device comprising the semiconductor switch controlled by the gate drive device of claim 1.

* * * * *